United States Patent
Huang et al.

(10) Patent No.: US 10,797,710 B2
(45) Date of Patent: Oct. 6, 2020

(54) CLOCK GENERATOR AND METHOD FOR GENERATING CLOCK SIGNAL

(71) Applicant: NXP USA, INC., Austin, TX (US)

(72) Inventors: Yan Huang, Suzhou (CN); Jiawei Fu, Suzhou (CN); Jianluo Chen, Suzhou (CN); Bin Zhang, Suzhou (CN)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/438,406

(22) Filed: Jun. 11, 2019

(65) Prior Publication Data
US 2020/0287556 A1    Sep. 10, 2020

(30) Foreign Application Priority Data
Mar. 7, 2019    (CN) .......................... 2019 1 0174678

(51) Int. Cl.
| | |
|---|---|
| H03L 7/06 | (2006.01) |
| H03L 7/08 | (2006.01) |
| H03L 7/085 | (2006.01) |
| H03L 7/093 | (2006.01) |
| H03L 7/099 | (2006.01) |
| H03L 7/197 | (2006.01) |

(52) U.S. Cl.
CPC ............ *H03L 7/099* (2013.01); *H03L 7/1974* (2013.01)

(58) Field of Classification Search
CPC combination set(s) only.
See application file for complete search history.

(56) References Cited

U.S. PATENT DOCUMENTS

| | | | |
|---|---|---|---|
| 5,841,324 A | 11/1998 | Williams | |
| 6,157,180 A | 12/2000 | Kuo | |
| 6,329,882 B1* | 12/2001 | Fayneh | H03L 7/0893 331/10 |
| 6,989,718 B2* | 1/2006 | Pretl | H03L 7/0898 327/157 |
| 7,095,287 B2* | 8/2006 | Maxim | H03L 7/0893 331/11 |
| 7,365,581 B2* | 4/2008 | Shi | H03L 7/0812 327/156 |
| 7,667,545 B2* | 2/2010 | Schlueter | H03L 7/0802 331/14 |
| 2010/0134191 A1 | 6/2010 | Kwan et al. | |

* cited by examiner

*Primary Examiner* — An T Luu

(57) ABSTRACT

A clock generator includes an oscillator that generates a clock signal as an output of the clock generator, where the frequency of the clock signal is dependent on a bias current. A feedback circuit receives the clock signal and generates a feedback signal indicative of a frequency of the clock signal. A voltage detector generates a charged voltage using the feedback signal, compares a source voltage with the charged voltage, and generates a detection signal indicative of the comparison between the source voltage and the charged voltage. A control voltage generator generates a control voltage using the detection signal. The bias current is generated by a bias current source using the control voltage.

19 Claims, 3 Drawing Sheets

CLOCK GENERATOR AND METHOD FOR GENERATING CLOCK SIGNAL

BACKGROUND

The present invention generally relates to a clock signal generator and, more particularly, to a clock signal generator that does not require a reference.

Many portable devices require an independent clock generator that provides a clock signal at a desired frequency. However, temperature and voltage levels, among other factors, can impact the accuracy of the clock signal.

Therefore, it is desirable to be able to generate a clock signal with little frequency drift and low power consumption.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a clock generator that includes an oscillator, a feedback circuit, a voltage detector, a control voltage generator, and a bias current source. The oscillator generates a clock signal, which is provided as an output of the clock generator. The feedback circuit is connected to the oscillator to receive the clock signal. The feedback circuit generates a feedback signal indicative of a frequency of the clock signal. The voltage detector is connected to the feedback circuit to receive the feedback signal. The voltage detector compares a source voltage with a charged voltage generated in response to the feedback signal, and generates a detection signal indicative of the comparison between the source voltage and the charged voltage. The control voltage generator is connected to the voltage detector to receive the detection signal and generate a control voltage in response to the detection signal. The bias current source is connected to the control voltage generator to receive the control voltage and generate a bias current in response to the control voltage. The frequency of the clock signal generated by the oscillator is dependent on the bias current.

In another embodiment, the present invention provides a method for generating a clock signal. The method includes generating a bias current by a bias current source using a control voltage. An oscillator then generates a clock signal using the bias current. A feedback circuit receives the clock signal and generates a feedback signal indicative of a frequency of the clock signal. A voltage detector compares a charged voltage, generated using the feedback signal, and a source voltage, generated using the control voltage. The voltage detector then generates a detection signal in response to the comparison of the charged voltage and the source voltage. A control voltage generator generates the control voltage using the detection signal.

In yet another embodiment, the present invention provides a clock generator including a control voltage generator, a bias current source, an oscillator, a feedback circuit, and a voltage detector. The control voltage generator generates a control voltage. The bias current source generates a bias current using the control voltage. The oscillator generates a clock signal using the bias current. The feedback circuit uses the clock signal to generate a feedback signal indicative of a frequency of the clock signal. The voltage detector provides to the control voltage generator a detection signal indicative of a comparison between a charged voltage generated in response to the feedback signal and a source voltage generated in response to the control voltage. The control voltage generator further modifies the control voltage using the detection signal.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
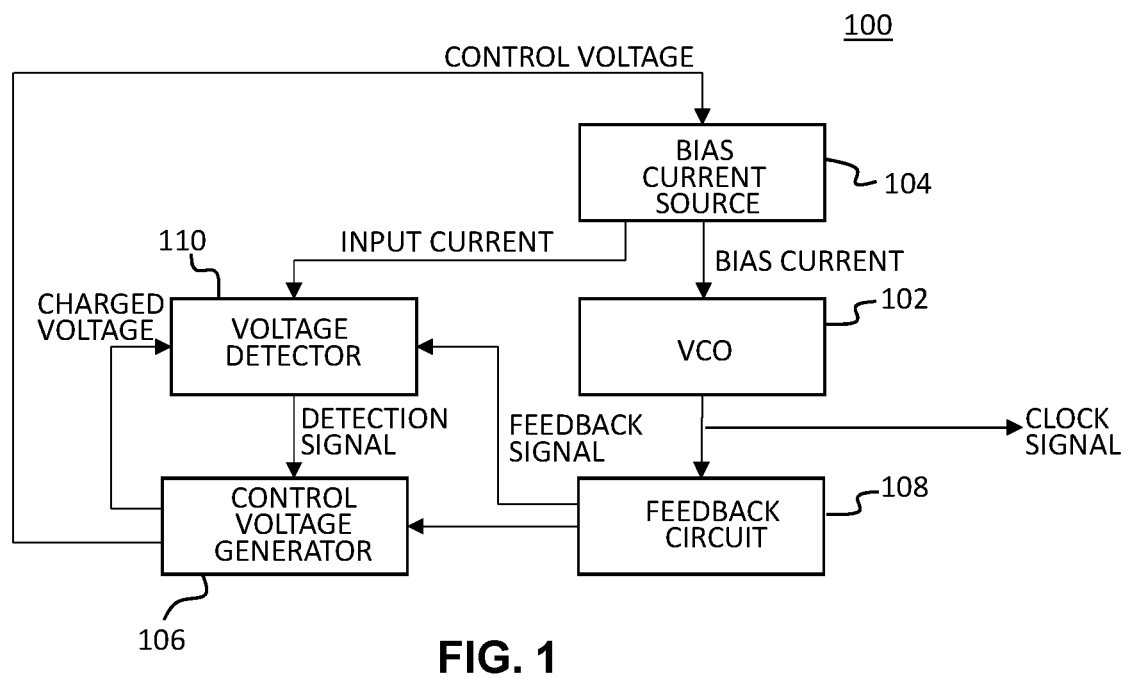
FIG. 1 is a block diagram of a clock generator according to an exemplary embodiment of the present invention.

FIG. 1 is a block diagram of a clock generator 100 according to an exemplary embodiment of the present invention. The clock generator 100 includes a voltage-controlled oscillator (VCO) 102, a bias current source 104, a control voltage generator 106, a feedback circuit 108, and a voltage detector 110. The VCO 102 generates a clock signal as the output of the clock generator 100. The VCO 102 operates using a bias current provided by the bias current source 104, and the frequency of the generated clock signal is adjusted using the bias current. In the presently preferred embodiment, the VCO 102 includes a ring oscillator having multiple series connected delay gates. The delay gates receive the bias current from the bias current source 104 and adjust a delay time based on the bias current, which adjusts the frequency of the generated clock signal.

The feedback circuit 108 is connected to the VCO 102 to receive the clock signal. The feedback circuit 108 uses the clock signal to generate a feedback signal that indicates the frequency of the clock signal. The feedback circuit 108 is connected to the voltage detector 110 to provide the feedback signal to the voltage detector 110. In the presently preferred embodiment, the feedback circuit 108 includes a frequency divider. The frequency divider generates the feedback signal with a frequency that is a fraction of the frequency of the clock signal from the VCO 102. Accordingly, the frequency divider in the feedback circuit 108 divides the frequency of the clock signal, and the generated feedback signal has a frequency indicative of but lower than the that of the clock signal.

The voltage detector 110 compares a charged voltage with a source voltage, and generates a detection signal indicative of the comparison result. More specifically, the voltage detector 110 is connected to the feedback circuit 108 to receive the feedback signal. The charged voltage is generated using the feedback signal. The source voltage is generated using a control voltage from the control voltage generator 106. For the purpose of generating the source voltage, the voltage detector 110 also is connected to the control voltage generator 106 to receive the control voltage.

As described above, the control voltage generator 106 generates the control voltage. Furthermore, the control voltage generator 106 is connected to the voltage detector 110 to receive the detection signal. The control voltage generator 106 adjusts the control voltage using the detection signal. The generated control voltage is provided to the bias current source 104 for generation of the bias current.

The charged voltage that is indicative of the frequency of the clock signal is compared by the voltage detector 110 with the source voltage that is indicative of the control voltage used to generate the clock signal. The detection signal from the voltage detector 110 reflects the difference between the charged voltage and the source voltage, and is used to adjust the control voltage. If the frequency of the clock signal drifts due to factors such as temperature, the detection signal will indicate the frequency drift. The control voltage can accordingly be adjusted using the detection signal, and in turn to modify the bias current used to generate the clock signal in order to keep the frequency of the clock signal stable (i.e., prevent the clock signal from drifting).

Figure 2:
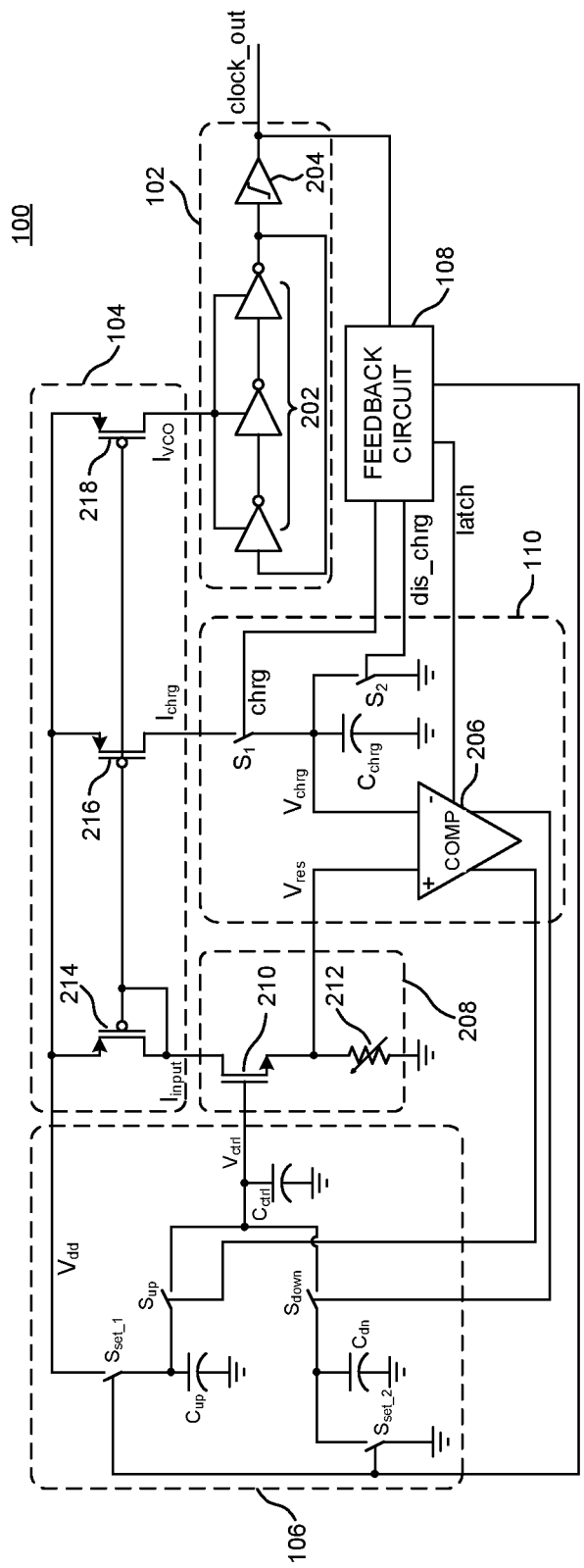
FIG. 2 is a circuit diagram of the clock generator of FIG. 1.

Referring now to FIG. 2, a circuit diagram of one embodiment of the clock generator 100 of FIG. 1 is shown.

The VCO 102 includes a ring oscillator 202. The ring oscillator 202 includes multiple series-connected delay gates that receive the bias current $I_{VCO}$ from the bias current source 104. Although three delay gates are shown, it will be understood by those of skill in the art that the oscillator 202 may include more than three delay gates. The ring oscillator 202 generates a clock signal. In the depicted embodiment, the VCO 102 further includes a level shifter 204 connected to the output of the ring oscillator 202. The level shifter 204 performs level shifting, typically shifting up, on the clock signal, and provides a level-shifted clock signal clock_out as the output of the clock generator 100.

The voltage detector 110 includes a charge capacitor $C_{chrg}$, a first switch $S_1$, and a second switch $S_2$. The charge capacitor $C_{chrg}$ has a first plate connected to ground, and a second plate connected to the first switch $S_1$. The second switch $S_2$ is connected between the second plate of the charge capacitor $C_{chrg}$ and ground. The charge capacitor $C_{chrg}$ provides a charged voltage $V_{chrg}$ at the second plate. The first switch $S_1$ is controlled by the feedback signal from the feedback circuit 108, and acts to connect and disconnect the charge capacitor $C_{chrg}$ with the bias current source 104. When the first switch $S_1$ is closed in response to the feedback signal, the charge capacitor $C_{chrg}$ is connected to the bias current source 104 to receive a charging current $I_{chrg}$, which charges the charge capacitor $C_{chrg}$. On the other hand, when the first switch $S_1$ is opened while the second switch $S_2$ is closed, the charge capacitor $C_{chrg}$ is connected to ground and discharged. In turn, the charged voltage $V_{chrg}$ provided by the charge capacitor $C_{chrg}$ goes to ground level.

The voltage detector 110 includes a comparator 206. The comparator 206 has a first input terminal (non-inverting input terminal) and a second input terminal (inverting input terminal). The first input terminal of the comparator 206 receives a source voltage $V_{res}$, and the second input terminal is connected to the second plate of the charge capacitor $C_{chrg}$ to receive the charged voltage $V_{chrg}$. In the embodiment shown, the comparator 206 is a latch comparator, which further receives, at a latch terminal thereof, a latch signal from the feedback circuit 108. The comparator 206 provides the detection signal as the output of the voltage detector 110 in response to the latch signal. In the presently preferred embodiment, the feedback circuit 108 generates the latch signal from the clock signal clock_out to ensure that the comparator 206 generates the detection signal based on the comparison between the charged voltage corresponding to the current frequency of the clock signal clock_out and the source voltage used for generating the clock signal at the current frequency.

The source voltage $V_{res}$ is generated by a source voltage generator 208 connected to the first input terminal of the comparator 206. Various embodiments of the voltage detector 110 may include the source voltage generator 208, and other embodiments may not. In the embodiment shown, the source voltage generator 208 includes a control transistor 210, which is an NMOS transistor, and a resistor 212. The NMOS transistor 210 has a gate terminal connected to the control voltage generator 106 to receive the control voltage $V_{ctrl}$, a drain terminal connected to the bias current source 104 to receive an input current $I_{input}$, and a source terminal connected to the first input terminal of the comparator 206 to provide the source voltage $V_{res}$. The resistor 212 is connected between the source terminal of the NMOS transistor 210 and ground. The NMOS transistor 210 turns on and off in response to the control voltage $V_{ctrl}$, and provides the source voltage $V_{res}$ accordingly. The source voltage $V_{res}$ is determined by: $V_{res}=V_{ctrl}-V_{thn}$, where $V_{thn}$ is a threshold voltage of the NMOS transistor 210.

The control voltage generator 106 includes an upper capacitor $C_{up}$ and a lower capacitor $C_{dn}$. The upper capacitor $C_{up}$ is connected to the supply voltage $V_{dd}$ by way of an upper setting switch $S_{set\_1}$, and the lower capacitor $C_{dn}$ is connected to ground by way of a lower setting switch $S_{set\_2}$. The upper setting switch $S_{set\_1}$ and the lower setting switch $S_{set\_2}$ receive setting signals from the feedback circuit 108. The upper and lower setting switches $S_{set\_1}$ and $S_{set\_2}$ close in response to the setting signals, to charge the upper capacitor $C_{up}$ and discharge the lower capacitor $C_{dn}$, respectively. Both the upper capacitor $C_{up}$ and the lower capacitor $C_{dn}$ are connected to a control capacitor $C_{ctrl}$. Specifically, the control capacitor $C_{ctrl}$ has a first plate connected to ground and a second plate that provides the control voltage $V_{ctrl}$. The upper capacitor $C_{up}$ is connected to the second plate of the control capacitor $C_{ctrl}$ by way of an upper control switch $S_{up}$. The lower capacitor $C_{dn}$ is connected to the second plate of the control capacitor $C_{ctrl}$ by way of a lower control switch $S_{down}$.

In operation, if the detection signal generated by the comparator 206 indicates that the source voltage $V_{res}$ is higher than the charged voltage $V_{chrg}$, then the lower control switch $S_{down}$ is closed to connect the lower capacitor $C_{dn}$ with the control capacitor $C_{ctrl}$, which discharges the control capacitor $C_{ctrl}$, and accordingly decreases the control voltage $V_{ctrl}$ provided by the control capacitor $C_{ctrl}$. On the other hand, if the detection signal indicates the source voltage $V_{res}$ is lower than the charged voltage $V_{chrg}$, then the upper control switch $S_{up}$ is closed to connect the upper capacitor $C_{up}$ with the control capacitor $C_{ctrl}$, which charges the control capacitor $C_{ctrl}$, and accordingly increases the control voltage $V_{ctrl}$. In the presently preferred embodiment, the detection signal output by the comparator 206 is a differential signal. The differential signal is respectively provided to the upper control switch $S_{up}$ and the lower control switch $S_{down}$.

The bias current source 104 includes first to third PMOS transistors 214, 216, and 218 that are connected as current mirrors. Source terminals of the first to third PMOS transistors 214, 216, and 218 are connected to the supply voltage $V_{dd}$. Gate and drain terminals of the first PMOS transistor 214 are connected together so that the first PMOS transistor 214 acts as a diode. The drain terminal of the first PMOS transistor 214 provides the input current $I_{input}$ to the control transistor 210. Gate terminals of the first to third PMOS transistors 214, 216, and 218 are connected together. The drain terminal of the second PMOS transistor 216 provides the charging current $I_{chrg}$ to the charge capacitor $C_{chrg}$. The drain terminal of the third PMOS transistor 218 provides the bias current $I_{VCO}$. It will be understood by those of skill in the art that the bias current $I_{VCO}$ and the charging current $I_{chrg}$ mirror the input current $I_{input}$.

Figure 3:
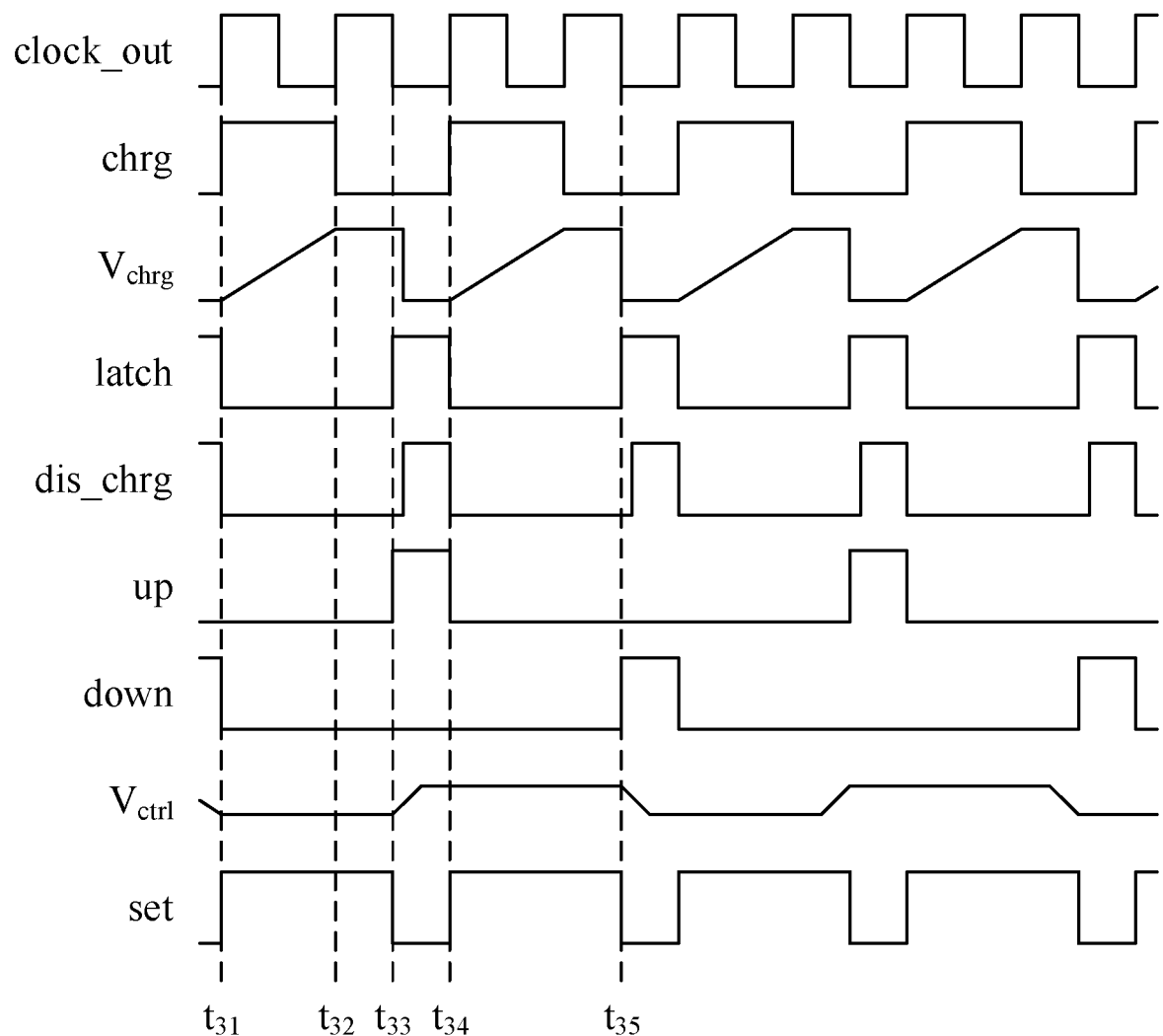
FIG. 3 is a timing diagram illustrating signals in the clock generator of FIG. 1.

The operation of the clock generator 100 of FIGS. 1 and 2 now will be explained with reference to FIG. 3, which is a timing diagrams of various signals in the clock generator 100. The depicted signals in FIG. 3 are:

"clock_out": the clock signal generated by the VCO 102;

"chrg": the feedback signal generated by the feedback circuit 108 and controlling the first switch $S_1$ of the voltage detector 110;

"$V_{chrg}$": the charged voltage provided by the charge capacitor $C_{chrg}$ to the second input terminal of the comparator 206;

"latch": the latch signal provided by the feedback circuit 108 to the latch terminal of the comparator 206;

"up": the detection signal provided by the comparator 206 to the upper control switch $S_{up}$;

"down": the detection signal provided by the comparator 206 to the lower control switch $S_{down}$;

"$V_{ctrl}$": the control voltage generated by the control voltage generator 106; and "set": the setting signals provided by the feedback circuit 108 to the upper and lower setting switches $S_{set\_1}$ and $S_{set\_2}$.

Starting at time $t_{31}$, the VCO 102 generates the clock signal "clock_out" at a designed frequency. The feedback circuit 108 receives the clock signal "clock_out", and provides the feedback signal "chrg" to the first switch $S_1$. In the depicted embodiment, the frequency of the feedback signal "chrg" applied to the first switch $S_1$ is half the frequency of the clock signal "clock_out". The first switch $S_1$ is closed when the feedback signal "chrg" is at the high state. This allows the charging current $I_{chrg}$ to be provided to the charge capacitor $C_{chrg}$, to charge the charge capacitor $C_{chrg}$. As a result, the charged voltage "$V_{chrg}$" increases when the feedback signal "chrg" remains at the high state. The setting signals "set" provided by the feedback circuit 108 are at the high state to close the upper and lower setting switches $S_{set\_1}$ and $S_{set\_2}$, respectively. The closed switches allow the upper capacitor $C_{up}$ to be charged, and lower capacitor $C_{dn}$ to be discharged.

At time $t_{32}$ when the feedback signal "chrg" drops from high to low, the charged voltage "$V_{chrg}$" is kept at the level where it was charged to. The charged voltage "$V_{chrg}$" is provided to the comparator 206 at its inverting input terminal. On the non-inverting input terminal of the comparator 206, the source voltage $V_{res}$ that was used to generate the clock signal "clock_out" is received. After that and at time $t_{33}$, the latch signal "latch" provided from the feedback circuit 108 to the latch terminal of the comparator 206 jumps to the high state, which causes the comparator 206 to output the detection signal based on the comparison between the source voltage $V_{res}$ and the charged voltage "$V_{chrg}$".

At time $t_{33}$ when the latch signal "latch" goes high, the source voltage $V_{res}$ is lower than the charged voltage "$V_{chrg}$", and accordingly the detection signal "up", which is provided by the comparator 206 to the upper control switch $S_{up}$, jumps to the high state. On the other hand, at the time $t_{33}$, the setting signals "set" provided to the upper and lower setting switches $S_{set\_1}$ and $S_{set\_2}$ jump to the low state. The high-state detection signal "up" closes the upper control switch $S_{up}$ to allow the upper capacitor $C_{up}$, which is already charged by the supply voltage $V_{dd}$, to charge the control capacitor $C_{ctrl}$. As a result, the control voltage "$V_{ctrl}$" provided by the control capacitor $C_{ctrl}$ increases.

It is understood that if the frequency of the generated clock signal "clock_out" decreases, then the time of each cycle of the clock signal increases based on the equation t=1/f, where t is the cycle time of the clock signal, and f is the frequency. The feedback signal "chrg" will have more time to close the first switch $S_1$ of the voltage detector 110 and charge the charge capacitor $C_{chrg}$. The longer the charge capacitor Cchrg is charged by the charging current $I_{chrg}$, the higher the charged voltage $V_{chrg}$ is provided. In the current case where it is desired to increase the frequency of the clock signal "clock_out", it is necessary to use the detection signal to increase the control voltage $V_{ctrl}$, and in turn to increase the bias current $I_{VCO}$.

Subsequently, the increased control voltage $V_{ctrl}$ causes the input current $I_{input}$ to increase, and the bias current $I_{VCO}$ mirroring the input current $I_{input}$ increases, which causes the frequency of the clock signal "clock_out" to increase. Shortly after time $t_{33}$, the feedback signal "dis_chrg" provided to the second switch $S_2$ goes high, which discharges the charge capacitor $C_{chrg}$, so the charged voltage $V_{chrg}$ goes to the ground level.

At time $t_{34}$, which is the end of the high state of the latch signal "latch" and the beginning of the high state of the feedback signal "chrg", the charge capacitor $C_{chrg}$ is started with another round of charging to generate the charged voltage $V_{chrg}$ indicative of the frequency of the latest clock signal "clock_out".

At a following high state of the latch signal "latch" at time $t_{35}$, the source voltage $V_{res}$ is higher than the charged voltage "$V_{chrg}$", which means the charge capacitor $C_{chrg}$ is charged with a time shorter than desired and the frequency of the clock signal "clock_out" goes high, so it is desired to decrease the frequency of the clock signal by pulling down the control voltage "$V_{ctrl}$" and the bias current $I_{VCO}$. At time $t_{35}$, the detection signal "down" provided to the lower control switch $S_{down}$ goes to the high state. The lower control switch $S_{down}$ closes to connect the control capacitor $C_{ctrl}$ and the lower capacitor $C_{dn}$, to charge the control capacitor $C_{ctrl}$ and decrease the control voltage $V_{ctrl}$. As a result of the decreased bias current $I_{VCO}$, the frequency of the generated clock signal "clock_out" drops.

The amount the control voltage $V_{ctrl}$ is increased or decreased depends on the relative ratios between the capacitance of the control capacitor $C_{ctrl}$ and the upper capacitor $C_{up}$ or the lower capacitor $C_{dn}$, shown as $$\Delta V_{ctrl} = \frac{C_{up} \times V_{dd}}{C_{ctrl} + C_{up}} \text{ or } \Delta V_{ctrl} = \frac{C_{dn} \times V_{dd}}{C_{ctrl} + C_{dn}}.$$

will be understood by those of skill in the art, the frequency of the clock signal "clock_out" can be calibrated by configuring the upper capacitor $C_{up}$, the lower capacitor $C_{dn}$, and the control capacitor $C_{ctrl}$.

The clock generator as described includes a calibration loop structure by generating a charged voltage signal indicative of the frequency of the generated clock signal, comparing the charged voltage signal with the control voltage signal from which the clock signal is generated, and using the detection signal generated from the comparison to adjust the control voltage signal to further calibrate the bias current provided to the oscillator. The frequency of the clock signal can be maintained at a relatively stable level against temperature, aging, and other peripheral factors.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A clock generator that generates a clock signal, comprising:
    an oscillator that generates the clock signal;
    a feedback circuit connected to the oscillator to receive the clock signal, wherein the feedback circuit generates a feedback signal indicative of a frequency of the clock signal;
    a voltage detector connected to the feedback circuit to receive the feedback signal, wherein the voltage detector compares a source voltage with a charged voltage generated using the feedback signal, and generates a detection signal indicative of the comparison between the source voltage and the charged voltage;
    a control voltage generator connected to the voltage detector to receive the detection signal, wherein the control voltage generator generates a control voltage using the detection signal; and
    a bias current source connected to the control voltage generator to receive the control voltage, wherein the bias current source generates a bias current using the control voltage, and wherein the frequency of the clock signal generated by the oscillator is dependent on the bias current,
    wherein the voltage detector comprises a charge capacitor that provides the charged voltage, and wherein the charge capacitor is charged in response to the feedback signal.

2. The clock generator of claim 1, wherein the voltage detector is connected to the bias current source in response to the feedback signal.

3. The clock generator of claim 2, wherein the charge capacitor receives a charging current from the bias current source in response to the voltage detector being connected to the bias current source, and wherein the charging current mirrors the bias current.

4. The clock generator of claim 1, wherein the feedback circuit is a frequency divider configured to divide a frequency of the clock signal to generate the feedback signal.

5. A clock generator that generates a clock signal, comprising:
    an oscillator that generates the clock signal;
    a feedback circuit connected to the oscillator to receive the clock signal, wherein the feedback circuit generates a feedback signal indicative of a frequency of the clock signal;
    a voltage detector connected to the feedback circuit to receive the feedback signal, wherein the voltage detector compares a source voltage with a charged voltage generated using the feedback signal, and generates a detection signal indicative of the comparison between the source voltage and the charged voltage;
    a control voltage generator connected to the voltage detector to receive the detection signal, wherein the control voltage generator generates a control voltage using the detection signal; and
    a bias current source connected to the control voltage generator to receive the control voltage, wherein the bias current source generates a bias current using the control voltage, and wherein the frequency of the clock signal generated by the oscillator is dependent on the bias current, wherein:
        the voltage detector comprises a comparator that receives the source voltage at a first input terminal and the charged voltage at a second input terminal;
        the feedback circuit generates a latch signal in response to the clock signal, and provides the latch signal to a latch terminal of the comparator; and
        the comparator provides the detection signal indicative of the comparison between the source voltage and the charged voltage in response to the latch signal.

6. The clock generator of claim 5, wherein the feedback circuit is a frequency divider configured to divide a frequency of the clock signal to generate the feedback signal.

7. A clock generator that generates a clock signal, comprising:
    an oscillator that generates the clock signal;
    a feedback circuit connected to the oscillator to receive the clock signal, wherein the feedback circuit generates a feedback signal indicative of a frequency of the clock signal;
    a voltage detector connected to the feedback circuit to receive the feedback signal, wherein the voltage detector compares a source voltage with a charged voltage generated using the feedback signal, and generates a detection signal indicative of the comparison between the source voltage and the charged voltage;

a control voltage generator connected to the voltage detector to receive the detection signal, wherein the control voltage generator generates a control voltage using the detection signal; and a bias current source connected to the control voltage generator to receive the control voltage, wherein the bias current source generates a bias current using the control voltage, and wherein the frequency of the clock signal generated by the oscillator is dependent on the bias current, wherein the control voltage generator is connected to the voltage detector to provide the control voltage to the voltage detector, and wherein the voltage detector generates the source voltage using the control voltage.

8. The clock generator of claim 7, wherein the voltage detector comprises an NMOS transistor having a gate terminal that receives the control voltage, a drain terminal that receives an input current, and a source terminal that provides the source voltage, wherein the source terminal is connected to ground by way of a resistor, and wherein the bias current mirrors the input current.

9. The clock generator of claim 8, wherein the bias current source comprises a PMOS transistor having a source terminal connected to a supply voltage, and a drain terminal and a gate terminal that are connected to each other, wherein the drain terminal of the PMOS transistor is connected to the drain terminal of the NMOS transistor of the voltage detector to provide the input current.

10. The clock generator of claim 7, wherein the feedback circuit is a frequency divider configured to divide a frequency of the clock signal to generate the feedback signal.

11. A clock generator that generates a clock signal, comprising:

an oscillator that generates the clock signal;

a feedback circuit connected to the oscillator to receive the clock signal, wherein the feedback circuit generates a feedback signal indicative of a frequency of the clock signal;

a voltage detector connected to the feedback circuit to receive the feedback signal, wherein the voltage detector compares a source voltage with a charged voltage generated using the feedback signal, and generates a detection signal indicative of the comparison between the source voltage and the charged voltage;

a control voltage generator connected to the voltage detector to receive the detection signal, wherein the control voltage generator generates a control voltage using the detection signal; and a bias current source connected to the control voltage generator to receive the control voltage, wherein the bias current source generates a bias current using the control voltage, and wherein the frequency of the clock signal generated by the oscillator is dependent on the bias current, wherein the control voltage generator increases the control voltage in response to the detection signal indicating that the source voltage is lower than the charged voltage, and decreases the control voltage in response to the detection signal indicating that the source voltage is higher than the charged voltage, and wherein the control voltage generator comprises a control capacitor having a first plate connected to ground and a second plate providing the control voltage, wherein the control capacitor is charged in response to the detection signal indicating that the source voltage is lower than the charged voltage to increase the control voltage, and wherein the control capacitor is discharged in response to the detection signal indicating that the source voltage is higher than the charged voltage to decrease the control voltage.

12. The clock generator of claim 11, wherein the control voltage generator further comprises an upper capacitor and a lower capacitor respectively connected to the second plate of the control capacitor, wherein the upper capacitor is configured to charge the control capacitor in response to the detection signal indicating that the source voltage is lower than the charged voltage, and the lower capacitor is configured to discharge the control capacitor in response to the detection signal indicating that the source voltage is higher than the charged voltage.

13. The clock generator of claim 11, wherein the feedback circuit is a frequency divider configured to divide a frequency of the clock signal to generate the feedback signal.

14. A method for generating a clock signal, comprising:

generating a bias current with a bias current source using the control voltage;

generating the clock signal with an oscillator using the bias current;

generating a feedback signal with a feedback circuit using the clock signal, wherein the feedback signal is indicative of a frequency of the clock signal;

comparing, by a voltage detector, a charged voltage generated using the feedback signal and a source voltage generated using the control voltage;

generating a detection signal with the voltage detector in response to the comparison of the charged voltage and the source voltage; and generating the control voltage with a control voltage generator using the detection signal, wherein generating the bias current comprises:

receiving, by an NMOS transistor, the control voltage at a gate terminal thereof;

receiving, by a first PMOS transistor, a supply voltage at a source terminal thereof;

connecting a drain terminal of the first PMOS transistor to a drain terminal of the NMOS transistor to provide an input current;

mirroring the first PMOS transistor with a second PMOS transistor; and generating the bias current with the second PMOS transistor.

15. The method of claim 14, A method for generating a clock signal, comprising:

generating a bias current with a bias current source using the control voltage;

generating the clock signal with an oscillator using the bias current;

generating a feedback signal with a feedback circuit using the clock signal, wherein the feedback signal is indicative of a frequency of the clock signal;

comparing, by a voltage detector, a charged voltage generated using the feedback signal and a source voltage generated using the control voltage;

generating a detection signal with the voltage detector in response to the comparison of the charged voltage and the source voltage; and generating the control voltage with a control voltage generator using the detection signal, wherein generating the control voltage comprises:

increasing the control voltage in response to the detection signal indicating that the source voltage is lower than the charged voltage, by:
  connecting a control capacitor to an upper capacitor to charge the control capacitor; and
  providing the control voltage by the control capacitor; or
decreasing the control voltage in response to the detection signal indicating that the source voltage is higher than the charged voltage, by:
  connecting a control capacitor to a lower capacitor to discharge the control capacitor; and
  providing the control voltage using the control capacitor.

16. A method for generating a clock signal, comprising:
generating a bias current with a bias current source using the control voltage;
generating the clock signal with an oscillator using the bias current;
generating a feedback signal with a feedback circuit using the clock signal, wherein the feedback signal is indicative of a frequency of the clock signal;
comparing, by a voltage detector, a charged voltage generated using the feedback signal and a source voltage generated using the control voltage;
generating a detection signal with the voltage detector in response to the comparison of the charged voltage and the source voltage; and
generating the control voltage with a control voltage generator using the detection signal,
wherein comparing the charged voltage and the source voltage comprises:
  providing a charging current to a charge capacitor in response to the feedback signal to charge the charge capacitor;
  generating the charged voltage with the charge capacitor;
  receiving, by an NMOS transistor, the control voltage at a gate terminal and an input current at a drain terminal, wherein the bias current mirrors the input current;
  providing the source voltage at a source terminal of the NMOS transistor; and
comparing the charged voltage and the source voltage with a comparator.

17. A clock generator, comprising:
a control voltage generator that generates a control voltage;
a bias current source, connected to the control voltage generator, that generates a bias current using the control voltage;
an oscillator, connected to the bias current source, that generates a clock signal using the bias current;
a feedback circuit, connected to the oscillator, that uses the clock signal to generate a feedback signal indicative of a frequency of the clock signal;
a voltage detector, connected to the feedback circuit and the control voltage generator, that generates a detection signal indicative of a comparison between a charged voltage generated using the feedback signal and a source voltage generated using the control voltage; and
a control transistor having a gate terminal connected to the control voltage generator to receive the control voltage, a drain terminal connected to receive an input current, and a source terminal connected to the voltage detector to provide the source voltage,
wherein the control voltage generator modifies the control voltage using the detection signal.

18. The clock generator of claim 17, wherein:
the bias current source comprises a diode-connected first PMOS transistor having a source terminal connected to a supply voltage and a drain terminal that provides the input current, a second PMOS transistor that mirrors the first PMOS transistor to provide the bias current, and a third PMOS transistor that also mirrors the first PMOS transistor to provide a charging current; and
the voltage detector comprises a charge capacitor that provides the charged voltage, wherein the charge capacitor is connected to the third PMOS transistor in response to the feedback signal to be charged using the charging current.

19. A clock generator, comprising:
a control voltage generator that generates a control voltage;
a bias current source, connected to the control voltage generator, that generates a bias current using the control voltage;
an oscillator, connected to the bias current source, that generates a clock signal using the bias current;
a feedback circuit, connected to the oscillator, that uses the clock signal to generate a feedback signal indicative of a frequency of the clock signal; and
a voltage detector, connected to the feedback circuit and the control voltage generator, that generates a detection signal indicative of a comparison between a charged voltage generated using the feedback signal and a source voltage generated using the control voltage,
wherein the control voltage generator modifies the control voltage using the detection signal,
wherein the control voltage generator comprises a control capacitor that provides the control voltage, wherein the control capacitor is, depending on the detection signal, connected to one of an upper capacitor to be charged and a lower capacitor to be discharged.

* * * * *